United States Patent
Song et al.

(10) Patent No.: US 6,690,187 B2
(45) Date of Patent: Feb. 10, 2004

(54) APPARATUS FOR TESTING RELIABILITY OF INTERCONNECTION IN INTEGRATED CIRCUIT

(75) Inventors: Won-Sang Song, Seoul (KR); Jung-Woo Kim, Kyunggi-do (KR); Chang-Sub Lee, Suwon (KR); Sam-Young Kim, Seoul (KR); Young-Jin Wee, Kyunggi-do (KR); Ki-Chul Park, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/114,735

(22) Filed: Apr. 1, 2002

(65) Prior Publication Data

US 2003/0020507 A1 Jan. 30, 2003

(30) Foreign Application Priority Data

Jul. 24, 2001 (KR) ........................................ 2001-44449

(51) Int. Cl.$^7$ .............................................. G01R 31/02
(52) U.S. Cl. ........................ 324/763; 324/537; 324/719
(58) Field of Search ................................ 324/537–538, 324/716, 719, 763, 765, 158.1; 257/734, 758, 767, 773–776, 920

(56) References Cited

U.S. PATENT DOCUMENTS 5,514,974 A * 5/1996 Bouldin ...................... 324/763
5,900,735 A * 5/1999 Yamamoto .................. 324/537
6,054,721 A   4/2000 Milor
6,297,644 B1 * 10/2001 Jarvis et al. ................ 324/537

* cited by examiner

Primary Examiner—Evan Pert
Assistant Examiner—Minh N. Tang
(74) Attorney, Agent, or Firm—Marger Johnson & McCollom, P.C.

(57) ABSTRACT

In the present invention, an apparatus of testing a leakage protection reliability of an integrated circuit interconnection. The apparatus has at least one comb-like pattern, a serpentine-like pattern and means of applying a bias to the patterns and forms a maximum field region at an interconnection formed around a via, i.e., at the end of a tooth portion composing the comb-like pattern. In one structure of the present invention, the comb-like pattern is formed at one level, and the serpentine-like pattern has a plurality of unit parts corresponding to the tooth portions, respectively, and connection parts connecting the neighboring two unit parts. Each of the unit parts is formed at the same level with the comb-like pattern and spaced apart from the tooth portion by a minimum design length according to a design rule. The unit part has vias formed through an interlayer dielectric layer at the both ends of a tooth parallel part, two tooth parallel parts connected with the vias, respectively, and a length parallel part electrically connecting two tooth parallel parts.

6 Claims, 8 Drawing Sheets

APPARATUS FOR TESTING RELIABILITY OF INTERCONNECTION IN INTEGRATED CIRCUIT

RELATED APPLICATION

This application relies for priority upon Korean Patent Application No. 2001-44449, filed on Jul. 24, 2001, the contents of which are herein incorporated by reference in their entirety.

FIELD OF THE INVENTION

The present invention relates to an apparatus of testing an integrated circuit interconnection. More particularly, the present invention relates to a test apparatus which is suitable for testing the leakage protection reliability of an integrated circuit interconnection having a high via density.

BACKGROUND OF THE INVENTION

As semiconductor devices become highly integrated, the sizes of individual devices and wires or interconnections become smaller. As one method of highly integrating the semiconductor devices, semiconductor devices may be made to have three-dimensional structures. For example, interconnections of connecting semiconductor devices are formed of a plurality of layers to have a three-dimensional structure in the semiconductor devices.

In a very narrow region of a highly integrated semiconductor device, it is very difficult to connect cells through a contact formed between an interconnection and an interlayer dielectric layer. For example, in a plurality of interconnection layers, a pattern has a propensity for being somewhat larger than a desired size according to an interconnection layer. A via contact, connecting an upper interconnection with a lower interconnection for a unified circuit, may as a result be misaligned. This produces undesirable shorts between circuit nodes that should not be connected or opens between circuit notes that should be connected.

In order to eliminate problems such as shorts or leakage currents, it is required to examine a leakage protection reliability between a via/contact and interconnections of various types in designs of a semiconductor device. When a circuit is designed according to a given design rule, reliability testing of an interconnection may be performed. That is, in relation to a pattern in a circuit, weak spots where a maximum field would be expected, or where a gap between patterns is at a minimum under the design rule, are artificially formed, and a maximum voltage is applied thereto. In order to increase the efficiency of such a test, the weak spots of the designed circuit are formed into impressing a plurality of repeated patterns and a known voltage differential is applied across opposed pattern pairs. The form of the pattern may not be identical to variable and complex real world patterns, but typically are simplified and fixed. For testing leakage protection reliability, standard comb-comb pattern or comb-serpentine pattern is used.

However, such a method evaluates leakage protection reliability only between interconnections in one layer. This is because, in an initial step of fabricating an integrated circuit, contacts or vias connecting between different layers typically have a lower density than the density of interconnections formed within a given layer. Additionally, when a via or a contact is required, it is possible to form it at an untroubled point in the layout, i.e. a low-density circuit area. Thus, conventional apparatus for testing an integrated circuit is useful only for detecting problems between adjacent interconnections in one layer rather than problems of via or contact interconnections between layers.

FIG. 1 illustrates conventional apparatus for testing a comb-serpentine pattern within an integrated circuit.

Referring to FIG. 1, each of the comb patterns 10 and 20 has one (vertical) length portion, and a plurality of (horizontal) tooth portions protruded from the length portion at the same circuit layer level with the length portion. The tooth portions are orthogonal to the length portion, parallel to one another and repeated, thereby having the same length. In a test apparatus, a pair of comb patterns 10 and 20 are aligned facing each other, with the tooth portions of one comb pattern interleaved with tooth portions of the other comb pattern. A serpentine pattern 30 is formed between the pair of comb patterns. Through the pair of comb patterns, the serpentine pattern 30 passes parallel to and between the tooth portions and turns 180° as illustrated in a region between the length portion of one comb pattern and the end of the tooth portion of the other comb pattern. Maximum potential differences are impressed around the ends of the tooth portion and the neighboring parts of the serpentine pattern. Since a maximum electric field 40 is localized at every end of the tooth portions, there are plural maximum electric fields 40. When neither leakage nor shorts are detected at the every maximum electric field 40, the design of a semiconductor device exhibits stability and reliability. A minimum design length (spacing or gap) is labeled "D".

However, conventional apparatus for testing a leakage or a short generated between interconnection layers may take the alternative form in FIG. 2. In this form, two conductive layers 50 and 60 are formed and one interlayer dielectric layer 70 is interposed therebetween. A bias voltage is applied between two electrodes 80 formed at the conductive layers. The form works for testing the reliability of an interlayer dielectric layer, but is too simplistic to detect real world problems related to a via or a contact according to multi-layered interconnections of a semiconductor device. Thus, in case of a via or a contact open or short problem in a relatively simple semiconductor device having few vias or contacts, the problem is diagnosed by an empirical method of trial and error.

As semiconductor devices become extremely highly integrated, and interconnections become multilayered, the density of vias or contacts increases. A short or a leakage current may be generated between a via and a neighboring interconnection. However, in a highly integrated semiconductor device, a small difference in process conditions may produce a large difference in results or effects. For example, if a different method is used to form a via hole and to fill the via hole with a conductive material, or if a different conductive material is used, a formed via may have a different characteristic with respect to the leakage current or the short.

For more specific examples, in an integrated semiconductor device, copper is used for an interconnection and a via to reduce resistance of an interconnection or a contact. But, when the copper is processed, the processed surface of copper or copper oxide tends to be rough. Thus, the use of copper may produce a narrow interconnection gap due to rough surfaces and other surface irregularities. The result is a high probability of failure, in comparison with other interconnection metal having the same interconnection gap.

Additionally, when copper is used, a dual damascene process is generally employed because of difficulty in patterning. When the aspect ratio of the via hole is increased, a barrier layer is formed at the surface of the via hole by employing a sputtering method before filling the via hole with metal. But, the barrier layer is not well stacked at an edge where the sidewall and the lower surface of the via hole are connected, so that the copper of high conductivity may make undesirable contact with a neighboring silicon oxide layer, and a leakage or an insulation breakdown may occur more frequently near the bottom of the via than in other regions.

The leakage or the short may have various causes. If there are a lot of problem spots, it is difficult to locate the failed spots and to correct them. Thus, without a systematic test, it is difficult to know whether a leakage or a short may occur between a via and a neighboring interconnection in a semiconductor device. Consequently, a systematic and operational method is needed to detect such via problems in a designed semiconductor device. In order to realize a solution, a test apparatus having a specific pattern is required, in which a design rule of a related semiconductor device is reflected and problem areas between vias and neighboring interconnections are discovered and avoided.

Despite having different objects and effects, U.S. Pat. No. 6,054,721 disclosed that one pattern of an apparatus of testing a leakage protection reliability between plane patterns may be changed. The idea is to evaluate alignment between patterns of different levels. In this case, a via is formed at an end of a tooth portion in a comb pattern, so that the end of the via is located between lower patterns of a different level. Thus, this case may be used for indicating a problem when an electric field is concentrated around the via. But, the disclosed apparatus would not indicate when the electric field was concentrated on the interconnection around the via.

SUMMARY OF THE INVENTION

Thus, it is an object of the present invention to provide a test apparatus of evaluating problem spots in cases where an electric field is concentrated on an interconnection around a via in a densely patterned circuit having multilayered interconnections.

It is another object of the present invention to provide a test apparatus which may easily and effectively detect a problem spot of a leakage or a short between vias and interconnections in multilayered interconnections.

It is still another object of the present invention to provide a test apparatus which may systematically and operationally detect problem spots of leakage currents or shorts between vias and interconnections in multilayered interconnections.

The present invention is directed to a test apparatus. The apparatus includes a comb-like pattern (hereinafter, simply, comb pattern) and a serpentine-like pattern (hereinafter, simply serpentine pattern) having vias, and applies a bias voltage to the patterns to form a spot where an electric field is concentrated, at an interconnection formed around vias, i.e., at the end of a tooth portion of the comb pattern.

In a first aspect of the present invention, at least one comb pattern has one straight length portion and a plurality of tooth portions protruding from the length portion, parallel with one another and having the same length. The serpentine pattern has a plurality of unit parts and connection parts. One unit part corresponds to one tooth portion and surrounds the one tooth portion. The connection part connects the unit parts. Each of the unit parts has two tooth parallel parts. Each tooth parallel part is formed at the same level with the comb pattern, parallel with and spaced apart from the tooth portion by a minimum design length according to a design rule.

But in case that the width of the via is wider than that of the tooth parallel part, the spaced distance may be wider. Also, the unit part is formed at a level different from that of the comb-like pattern and an interlayer dielectric layer is interposed between the levels of the unit part and the comb pattern. The unit part also includes a length parallel part and two vias. The length parallel part connects the ends of the two tooth parallel part and the vias connect the ends of the tooth parallel parts with the both ends of the length parallel part through the interlayer dielectric layer. The via is spaced apart from the end of the tooth portion by the minimum design length.

In a plan view of the unit part, the length parallel part and the tooth parallel part meet at right angles to each other. The connection part connects the neighboring two tooth parallel parts to electrically connect the two unit parts and to form the serpentine pattern. The connection part may be formed at the same level with the length parallel part and is connected with the tooth parallel part through a via as the tooth parallel part is connected with the length parallel part. Means of applying a certain bias voltage is included in the test apparatus, thereby generating a potential difference between the two patterns.

In the first aspect of the present invention, in a top plan view, the end of the tooth portion of the comb-like pattern is overlapped with the length parallel part connecting the ends of the two tooth parallel parts or located within the minimum design length deviation from the length parallel part.

The patterns may be formed of different conductive materials according to levels. The conductive material may be of a metal and a metal, a metal silicide and a semiconductor such as a doped polysilicon. The via may be formed of a material different from a conductive material of the upper level, or of another material of another level.

The tooth parallel part is longer than the length parallel part or the connection part at least by the minimum design length according to a design rule. Also, the length portion should be spaced apart from the connection part more than by the minimum design length.

According to a second aspect of the present invention, two comb-like patterns are set up together with one serpentine pattern. That is, one additional comb pattern is added in the first aspect having one comb pattern and one serpentine pattern. Two comb patterns are facing each other. Tooth portions of the additional comb pattern are running parallel with and interleaving with those of the original comb pattern.

Length portions and tooth portions of the two comb patterns are formed at the same level. The connection part of the serpentine pattern in the first structure has a level different from the tooth parallel part in the second structure, and is electrically connected with the tooth parallel part through a via formed at the end thereof in the first structure. The end of the tooth portion of the additional comb pattern is located at the central position between the ends of the two tooth parallel parts under the connection part and laterally spaced apart from the ends thereof. But, where the width of the via is wider than that of the tooth parallel part, the spaced distance may be wider. Also, the end of the tooth portion in the additional comb pattern is located within the minimum design length deviation from the central position between the ends of the neighboring two length parallel parts under the connection part.

Thus, in the second structure, the length parallel part may be called the connection part, since the function and component of the parts are identical with each other. The tooth parallel part is parallel to the tooth portion of the additional comb pattern. The vias are formed at the turning points where the length parallel parts or the connection parts meet the tooth parallel parts.

The additional comb pattern may have the same shape as the original comb pattern, thus overlapping it. Alternatively, the additional comb pattern may be different in length from the tooth parallel part, width and material thereof. Additionally, the length of the connection part may be different from that of the length parallel part.

The second structure may be defined independently without relation to the first structure. That is, in the second structure, at least a pair of comb patterns are included. Each of the comb patterns has one straight length portion, and a plurality of tooth portions protruding from the length portion, the tooth portions being parallel with one another and having identical lengths. The two comb patterns face each other at the same level and the tooth portions of the left comb pattern run parallel with and through those of the right comb pattern. The second structure includes one serpentine pattern comprising tooth parallel parts, first length parallel parts, second length parallel parts, and vias.

The tooth parallel parts are formed at the same level with the pair of comb patterns, spaced apart from the neighboring tooth portions by a given distance and parallel therewith. The first length parallel part is present at a level spaced from the level of the comb patterns by an interlayer dielectric layer and connecting the ends of the two tooth parallel parts adjacent the comb pattern in the left or right side of the serpentine pattern. The second length parallel part is present at a level spaced from the level of the comb patterns by an interlayer dielectric layer and connects the ends of the two tooth parallel parts adjacent to the comb pattern in the right or left side of the serpentine pattern. The vias connect the ends of the first and second length parallel parts with both ends of the tooth parallel part through an interlayer dielectric layer, respectively, at both ends of the tooth parallel part.

Additionally, the second structure has means of applying a certain bias to the comb pattern and the serpentine pattern to generate a potential difference therebetween. The second length parallel part corresponds to the connection part in the first structure but is not present at the same level.

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the attached figures, the distance between components and sizes thereof may be exaggerated for clarity.

Embodiment 1

Figure 1:
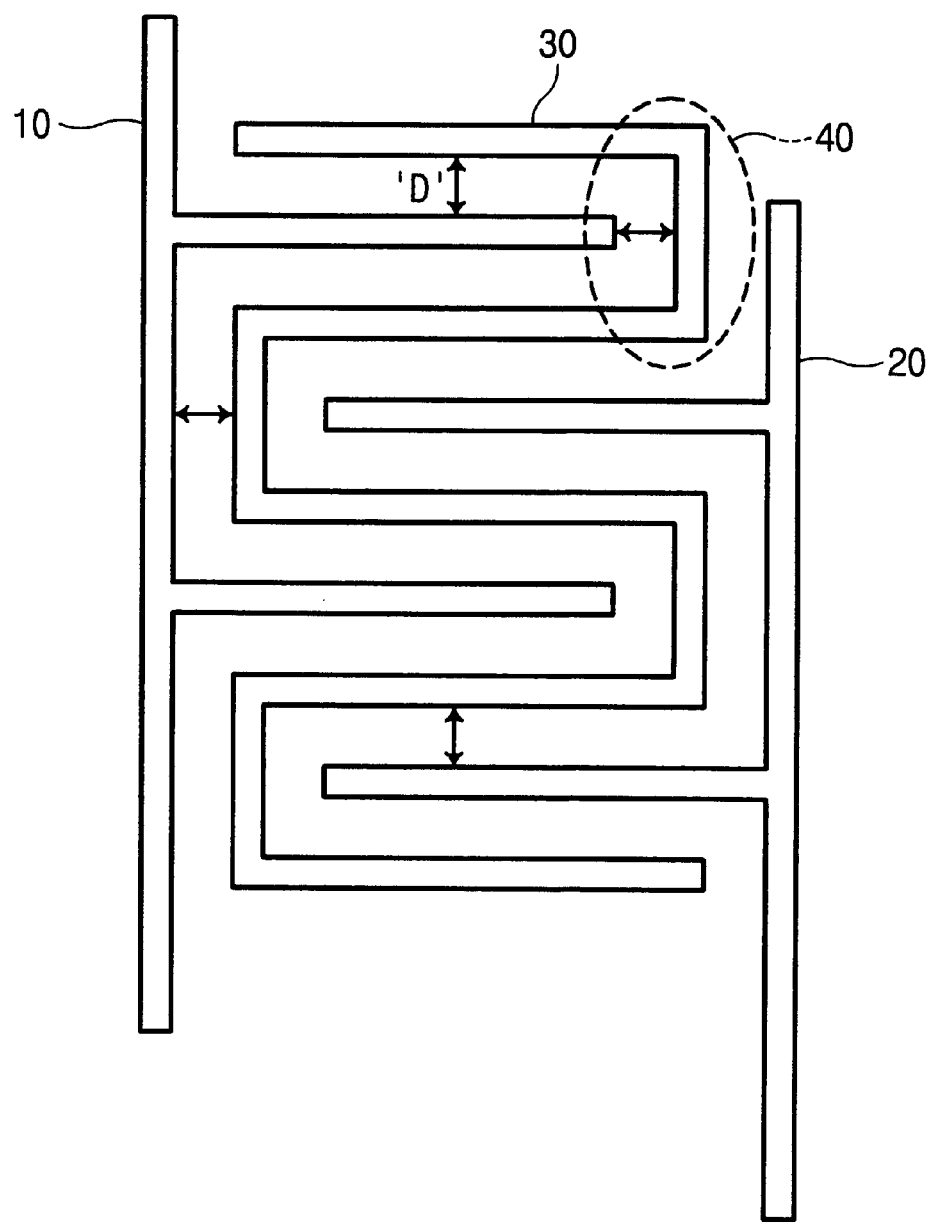
FIG. 1 illustrates a schematic plan view showing conventional apparatus of testing a comb-serpentine pattern as a typical example of a test integrated circuit.
Figure 2:
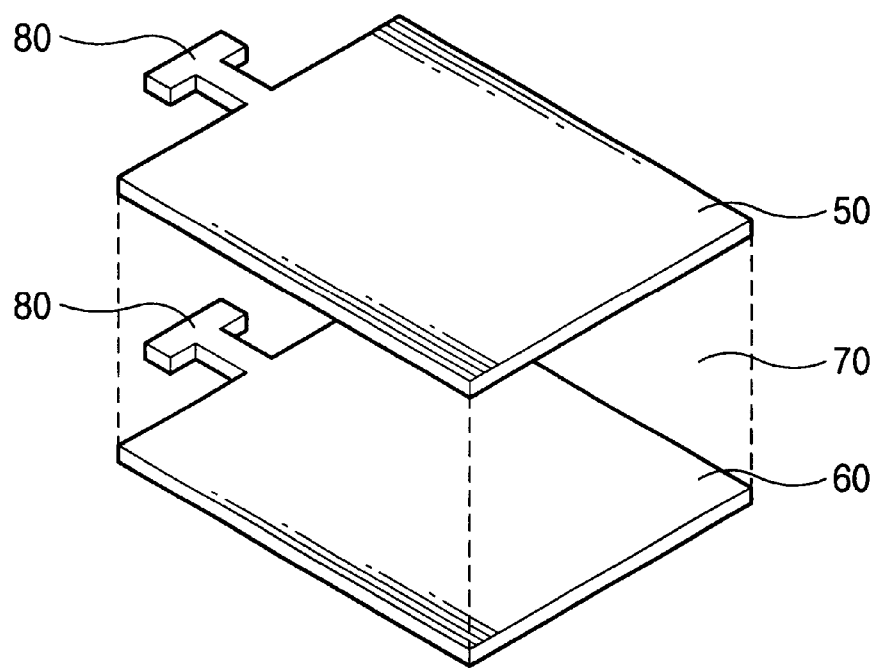
FIG. 2 illustrates a concept diagram showing conventional apparatus of testing a problem spot of leakage current or short between interconnection layers.
Figure 3:
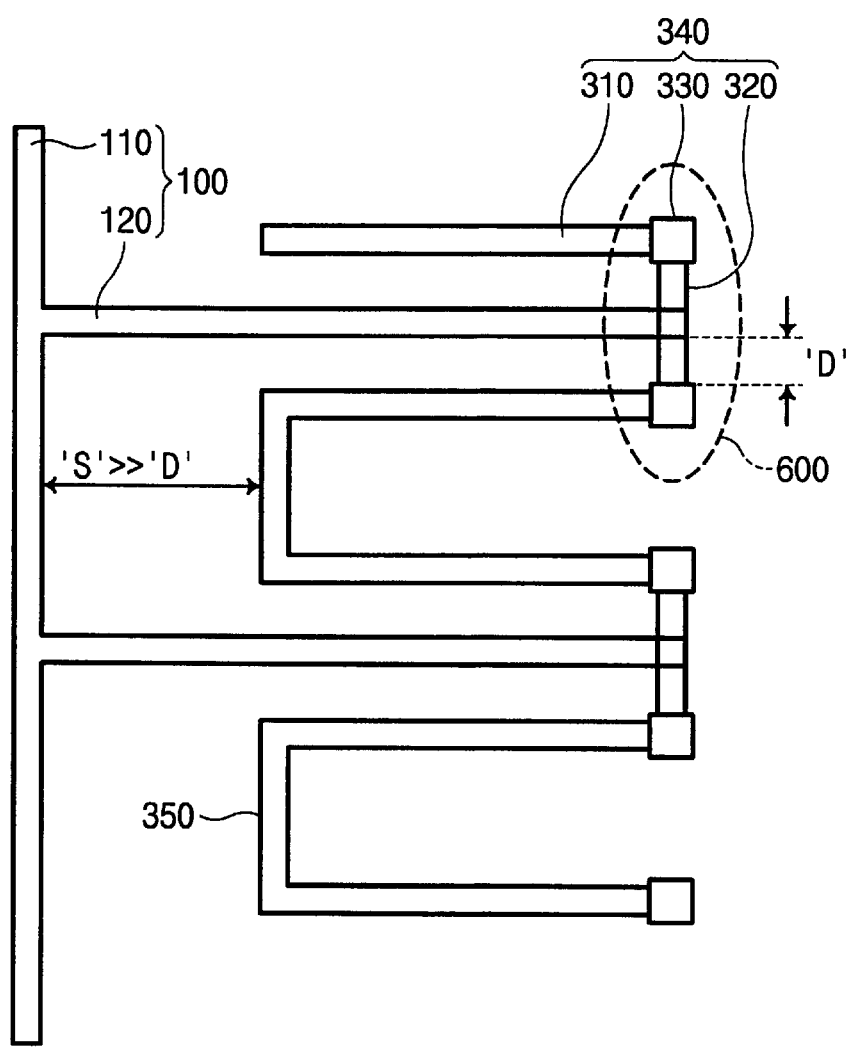
FIG. 3 illustrates a partial top plan view of a part in an embodiment where a comb pattern and a serpentine pattern are provided according to a first structure of the present invention.

FIG. 3 illustrates a partial top plan view of a part in an embodiment where a comb pattern and a serpentine pattern are provided according to a first structure of the present invention.

Figure 4:
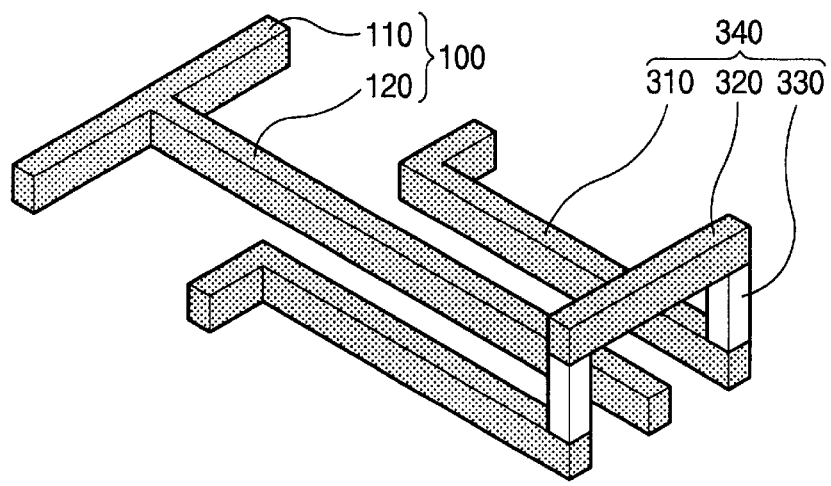
FIG. 4 illustrates a partial isometric view selectively showing a part which will be repeatedly formed, in the same embodiment with that of FIG. 3.

FIG. 4 illustrates a partial perspective view of parts which will be repeatedly formed, in an embodiment having the same partial plan view with FIG. 3, i.e., a tooth portion 120 and a connected length portion 110 of a comb pattern 100, and a neighboring unit part 340 and a connection part 350 of a serpentine pattern.

Referring to FIGS. 3 and 4, in the present embodiment 1, the tooth portion 120 of the comb pattern 100 is located at the central position between vias 330 formed at the ends of tooth parallel parts 310 of the serpentine pattern. The vias 330 extend to an upward direction from the ends of the tooth parallel parts 310, respectively, and the tooth parallel parts 310 are laterally spaced from the tooth portion 120 by a minimum design length 'D' according to a design rule in a semiconductor device for test. The vias 330 are wider than the tooth parallel part 310. Generally, the periphery of a via bottom tends to be weakest, so that the possibility of leakage is intimately related with the distance between the periphery of the via bottom and the neighboring interconnection pattern. If the width of the via 330 were identical with that of the tooth parallel part 310, and if the via 330 were exactly aligned with the tooth portion 310, the tooth parallel part 310 would be spaced laterally from the tooth portion 120 by the minimum design length 'D'.

Additionally, in FIG. 3, the end of the tooth portion 120 seems to be overlapped with a length parallel part 320 connecting the ends of the tooth parallel parts 310 at which the vias 330 are formed. Those of skill in the art will appreciate from FIG. 4 that, while overlapped in plain view of FIG. 3, nevertheless the end of the tooth portion 120 is located with the minimum design length 'D' deviation from the length parallel part 320. If the end of the tooth portion 120 is spaced too much apart from the length parallel part 320 or extends beyond the part 320, a maximum field region 600 is not formed around the neighboring interconnection of the via 330, i.e., around the end of the tooth portion 120.

The tooth parallel part 320 is longer than the length parallel part 310 or the connection part 350 at least by a minimum design length according to a design rule. The length of the tooth parallel part 310 is less than that of the tooth portion 120 by the distance 'S'. The distance 'S' is preferably longer than the minimum design length 'D' and conventionally several times thereof, so that a big electric field is not formed between the length portion 110 and the connection part 350.

The connection part 350 of the serpentine pattern is present at a lower interconnection layer under an interlayer dielectric layer, i.e., at the same level with the tooth parallel part 310. The both ends of the connection part 350 are directly connected with the ends of the tooth parallel parts at the position of the via 330.

The present embodiment typically would include plural interconnected instances of the illustrated parts in FIG. 4. Although not shown in the drawings, pads are formed at certain ends of the comb pattern and the serpentine pattern for applying a defined bias voltage in a subsequently formed test apparatus. When power is supplied to the pads, a potential difference develops between the comb pattern and the serpentine pattern.

In a method of forming the first structure like FIG. 4, a lower conductive layer is stacked using a semiconductor material such as an impurity-doped polysilicon, using a metal such as copper, or using a dual layer of a semiconductor and a metal silicide, on a semiconductor substrate. This is patterned to form a length portion and a tooth portion in the comb pattern and a connection part and a tooth parallel part in the serpentine pattern. When a lower interconnection is patterned, an interlayer dielectric layer is formed thereon. The interlayer dielectric layer may be formed of a CVD (chemical vapor deposition) silicon oxide layer which is generally used in a semiconductor device. A planarization process is preferably performed. A patterning process is performed to form a groove for a length parallel part composing an upper interconnection pattern, to a certain depth, through the interlayer dielectric layer. A via hole is formed through a part of the groove to expose the ends of the tooth portion at the lower interconnection pattern.

A conductive barrier layer is thinly formed at the substrate where the via hole is formed. The barrier layer is formed of a titanium/titanium nitride by employing a sputtering method. Then, a copper seed layer is stacked by a CVD method, and a bulk copper layer fills the groove and the via hole by employing an electroplate method. The copper layer and the barrier layer, which are formed on the interlayer dielectric layer, are eliminated by a CMP (chemical mechanical polishing) process. Thus, the via and the upper interconnection are formed of the same material layer. Alternative to the above dual damascene process, other processes may be employed. That is, a via hole is only formed through an interlayer dielectric layer and a via plug fills the via hole. A distinct conductive layer is stacked and patterned to form an upper interconnection pattern.

Figure 5:
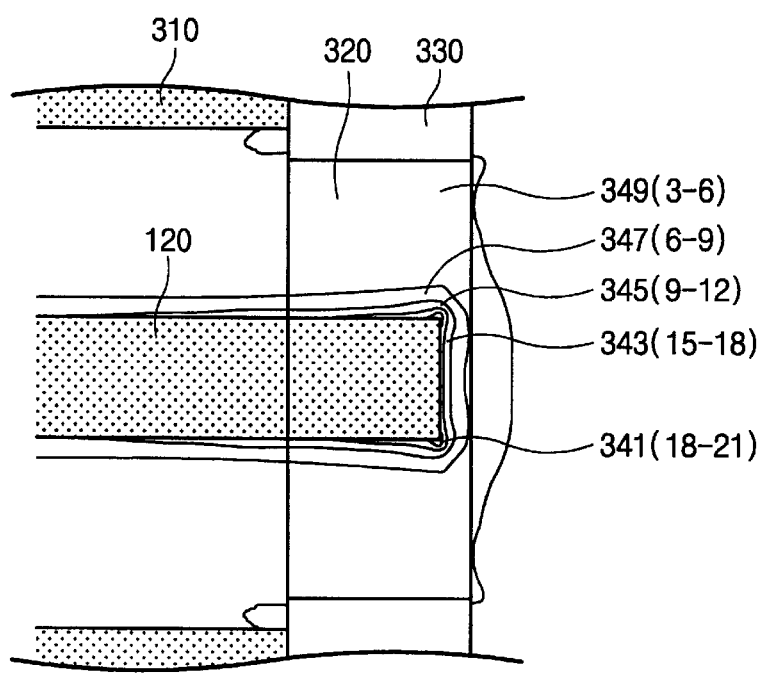
FIG. 5 illustrates an electric field profile showing a state when a bias voltage is applied to a terminal of each pattern in the same embodiment with FIG. 4.

FIG. 5 illustrates a plan view showing a field profile or a maximum field part by simulation of the same parts of FIG. 4, when a defined voltage differential is applied between a serpentine pattern and a comb pattern. The ends of the tooth parallel parts 310 are connected with the length parallel part 320 through the vias 330. The end of the tooth portion 120 is present between the ends of the tooth parallel parts 310 under the length parallel part 320. Maximum field region 341 corresponding to a relative electric field strength of approximately 18~21 appears around tip parts of the end of the tooth portion 120. Other electric field regions 343, 345, 347, and 349 corresponding to the relative electric field strengths sequentially appear to surround higher field regions. Through the analysis with respect to the figures, it is possible to know whether a failed problem spot is generated at the regions having a plurality of vias spaced by a design length in a semiconductor device. Also, it is possible to increase a reliability of a semiconductor device by testing a design thereof.

Comparative Example 1

Figure 6:
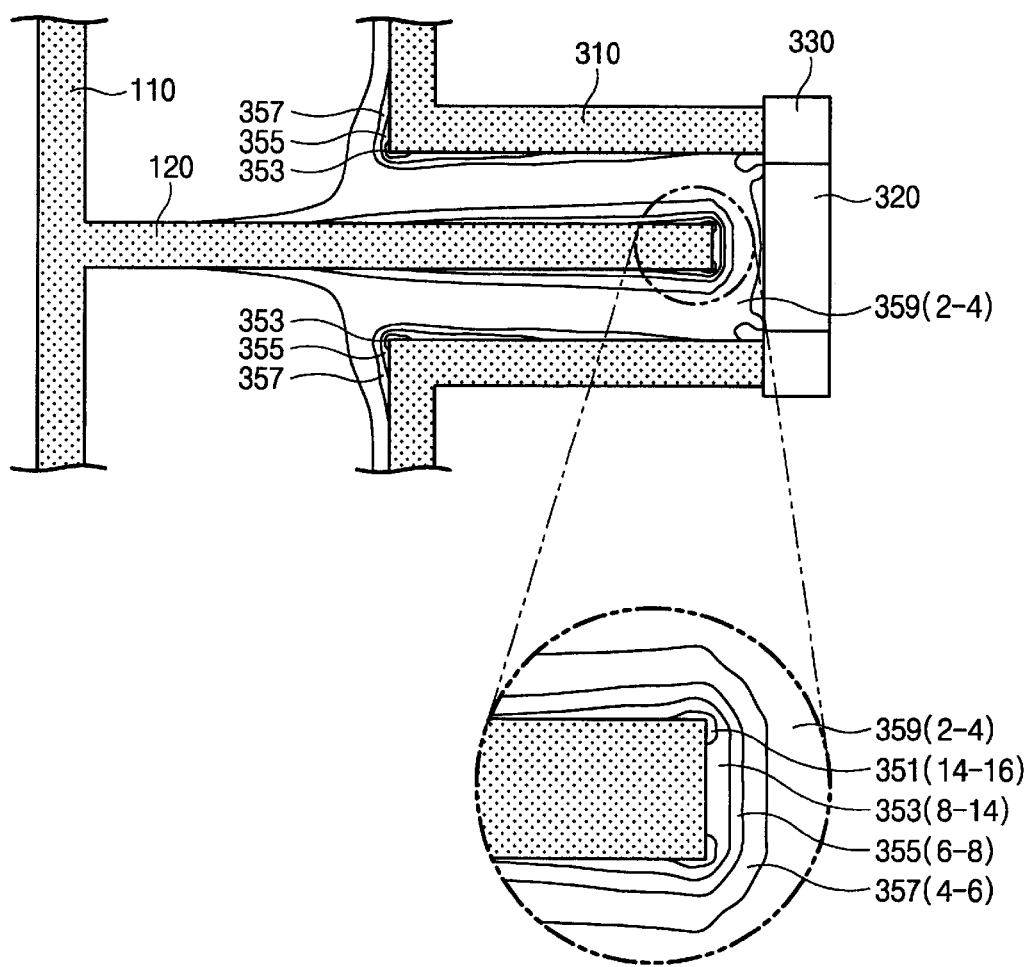
FIGS. 6 and 7 illustrate electric field profiles showing states when a bias voltage is applied to a terminal of each pattern in comparative examples of the present invention.

FIG. 6 illustrates a plan view showing an electric field profile or a maximum field part by simulation when a certain bias is applied between a serpentine pattern and a comb pattern, in a comparative example for being compared with the example 1. In FIG. 6, the end of the tooth portion 120 is spaced apart from the length parallel part 320 more than by the minimum design length 'D'. The maximum field strength in the first embodiment is approximately 18~21 at the maximum field region 341 like FIG. 5, but the present comparative example has the maximum field strength of only approximately 14~16 at the maximum field region 351.

Comparative Example 2

Figure 7:
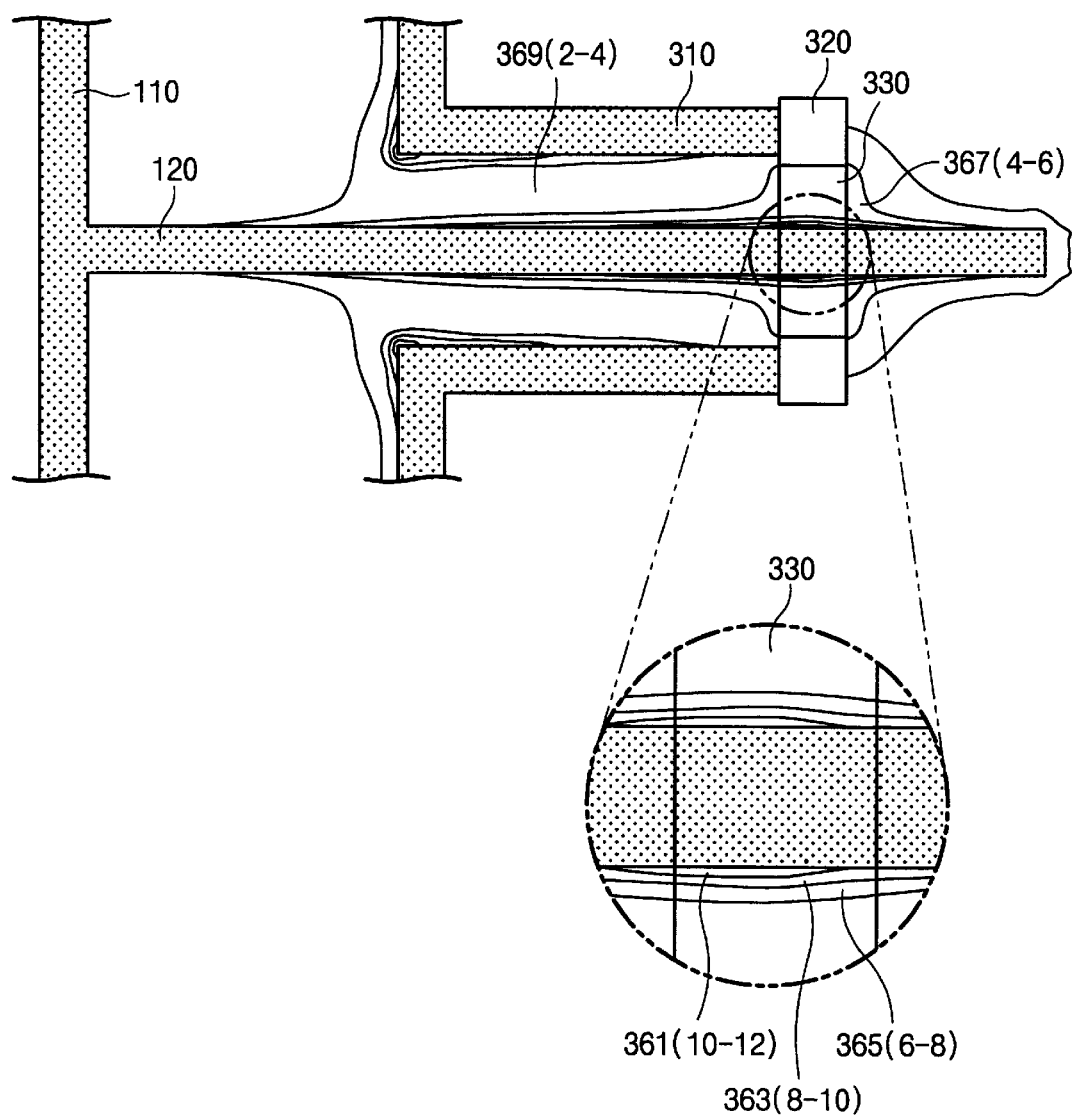

FIG. 7 illustrates a plan view showing an electric field profile by simulation when a certain voltage is applied between a serpentine pattern and a comb pattern. In FIG. 7, the end of the tooth portion 120 exceeds the position of the length parallel part 320 more than by the minimum design length 'D'. The present comparative example has the maximum electric field strength of only approximately 10~12 at the maximum field region 361 in comparison with the value of approximately 18~21 in the first embodiment.

Embodiment 2

Figure 8:
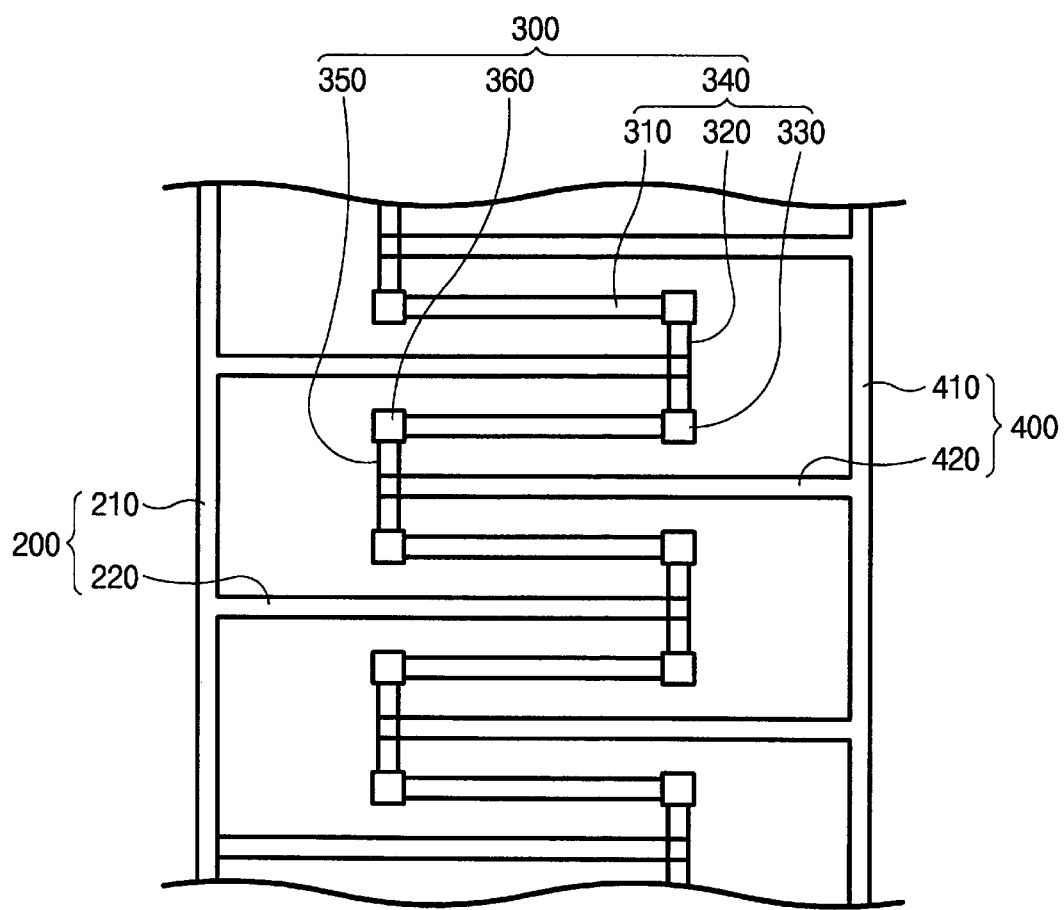
FIG. 8 illustrates a partial top plan view of an embodiment where a comb pattern and a serpentine pattern are provided according to a second structure of the present invention.

FIG. 8 illustrates a partial top plan view showing a part in a second embodiment, in which two comb patterns 200 and 400 and one serpentine pattern 300 are provided according to a second structure. In the present embodiment, one comb pattern 400 is further placed laterally from the serpentine pattern at the opposite position of the original comb pattern 200. The serpentine pattern 300 also acts as forming an electric field with respect to the additional comb pattern 400.

Figure 9:
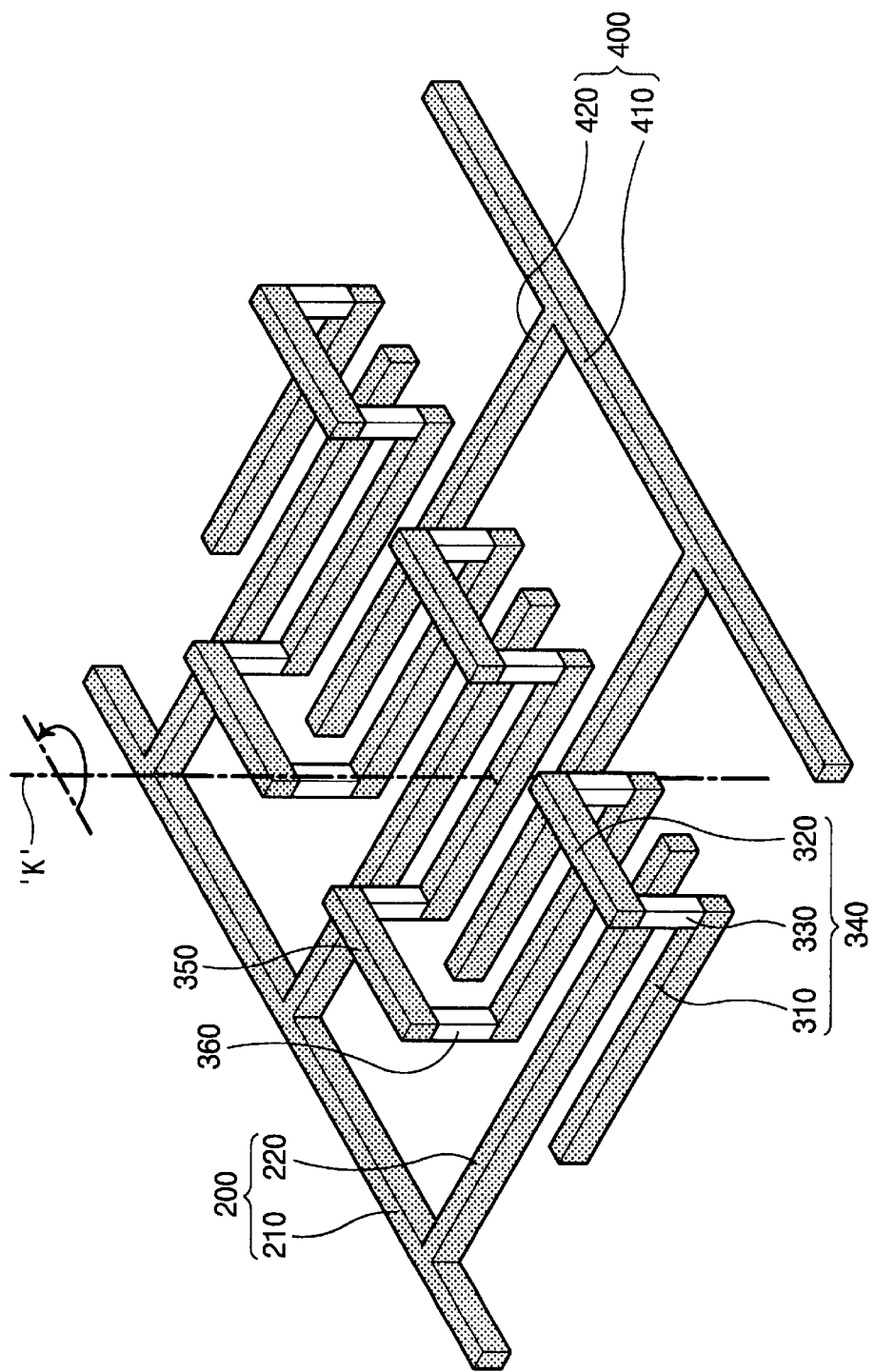
FIG. 9 illustrates a partial perspective view selectively showing a part which will be repeatedly formed, in the same embodiment with that of FIG. 8.

FIG. 9 illustrates a partial isometric view showing parts which will be repeatedly formed, in an embodiment having the same partial plan of FIG. 8.

Referring to FIGS. 8 and 9, the length portions 210 and 410, and the tooth portions 220 and 420 of the two comb patterns 200 and 400, and the tooth parallel part 310 of the serpentine pattern 300 are formed at a lower interconnection layer under an interlayer dielectric layer. The connection part 350 and the length parallel part 320 of the serpentine pattern 300 are formed at an upper interconnection layer over the interlayer dielectric layer. The parts illustrated in FIG. 9 are repeatedly connected with one another to form a core part of a test apparatus.

In the embodiment 2, the tooth portions 220 and 420 are located at the central positions between the tooth parallel parts 310 under the connection parts 250 and the length parallel parts 320, respectively, and the ends of the tooth portions 220 and 420 are laterally spaced apart from the neighboring vias 330 by the minimum design lengths. In FIG. 8, the end of the tooth portion 220 overlaps the length parallel part 320, and the end of the tooth portion 420 overlaps the connection part 350. The tooth parallel parts 310 should be longer than the length parallel parts 320 and the connection parts 350 at least by the minimum design length according to a design rule. When the length of the tooth parallel part 310 is subtracted from that of the tooth portion 420 in the additional comb-like pattern 400, the remnant length should be longer than the minimum design length according to the design rule and preferably several times thereof, so that an excessive electric field is not formed between the length portion 410 and the connection part 350.

Although the illustrated parts in FIG. 9 are rotated 180° on a vertical axis 'K', the rotated patterns have the same shape with the original patterns, i.e. the patterns are symmetric. Thus, in the present embodiment, the length parallel part 320 is connected with a tooth parallel part 310 through an additional via 360 and acts as a kind of the connection part 350. The connection part 350 and the length parallel part 320 are formed at the same upper interconnection layer over the interlayer dielectric layer. Also, one serpentine pattern 300 is used for forming an electric field between two comb patterns.

Except for these differences in the level of the length parallel part 320 and the shape of the entire structure, the present embodiment has similarities with the embodiment 1, since parts are repeatedly connected and the electric field may be localized around the end of the tooth portion 220 or 420 present between two neighboring vias 330 or 360 under the length parallel part 320 or the connection part 350. An apparatus for applying a bias voltage should be able to apply a certain bias to the additional comb pattern 400. Thus, all details, related to the comb pattern 200 or 400 and the serpentine pattern 300, may be identical with the embodiment 1. The tooth parallel part 310 is required to be much longer than the connection part 350, so that two collective vias 330 don't affect the two opposite collective vias 360. The second structure of the present embodiment 2 has an advantage in that a structure of forming two neighboring vias 330 or 360 may be more highly integrated.

However, differently from the present embodiment, tooth portions 220 and 420 in the two comb patterns 200 and 400, composing the second structure of the present invention, may have different lengths or different widths from each other to the exclusion that tooth portions 220 and 420 are sufficiently longer than the tooth parallel part 310. And the lengths of the tooth parallel part 310 and the connection part 350 may be different. In this case, when the patterns are rotated 180° on the vertical axis 'K', the rotated patterns are not identical with the original patterns.

According to the present invention, out of problems induced around a via and a neighboring interconnection according to multilayered interconnections and a narrow gap between patterns in a semiconductor device, with respect to the case in which an electric field is localized around an interconnection adjacent to a via, it is possible to find out a failed or problem spot such as a leakage current or a short easily and effectively by using a systematic and operational test apparatus.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. Apparatus for testing a leakage protection reliability of an integrated circuit interconnection, comprising:

at least one comb-like pattern comprising one straight length portion, and a plurality of tooth portions;

one serpentine-like pattern comprising a plurality of unit parts and at least one connection part; and means of applying a defined bias voltage between the comb-like pattern and the serpentine-like pattern to generate a potential difference between the two patterns, wherein the plurality of tooth portions protrude from the length portion, substantially parallel with one another and having substantially the same lengths, wherein each of the unit parts comprises:

two tooth parallel parts laterally spaced apart from the neighboring tooth portions by a certain distance, and extending substantially parallel therewith;

a length parallel part formed at a level different from the level of the comb-like pattern and connecting the ends of the two tooth parallel parts and forming turning points with the tooth parallel parts; and two vias connecting the ends of the two tooth parallel parts with the both ends of the length parallel part through an interlayer dielectric layer and spaced apart from the end of the neighboring tooth portion by a minimum design length according to a design rule, and wherein the connection part connects the ends of the neighboring two tooth parallel parts for connecting the two unit parts.

2. The apparatus as claimed in claim 1, wherein:

the end of the tooth portion is located within the minimum design length deviation from the length parallel part connecting the two vias in a top plan view; and the connection part is spaced apart from the length portion at least by the minimum design length.

3. The apparatus as claimed in claim 1, wherein the connection part is formed of the same material with the tooth parallel part at the same level.

4. The apparatus as claimed in claim 1, wherein the length portion, the tooth portion and the tooth parallel part formed at the same level, and wherein the length parallel part formed at a different level, are composed of different materials.

5. The apparatus as claimed in claim 1, wherein the tooth parallel part is longer than the length parallel part or the connection part at least by the minimum design length.

6. The apparatus as claimed in claim 1, wherein the connection part is formed at a different level spaced from the two tooth parallel parts by the interlayer dielectric layer, and both ends of the connection part are connected with the ends of the two tooth parallel parts by vias through the interlayer dielectric layer.

* * * * *